United States Patent [19]

Lue

[11] Patent Number: 4,690,274

[45] Date of Patent: Sep. 1, 1987

[54] CONTAINER FOR ELECTRONIC COMPONENTS

[75] Inventor: Hsueh C. Lue, Kaohsiung, Taiwan

[73] Assignee: U.S. Philips Corp., New York, N.Y.

[21] Appl. No.: 803,356

[22] Filed: Dec. 2, 1985

[30] Foreign Application Priority Data

May 15, 1985 [NL] Netherlands ........................ 8501400

[51] Int. Cl.⁴ ............................................. B65D 85/30
[52] U.S. Cl. ............................ 206/328; 220/DIG. 19; 361/380
[58] Field of Search ...................... 206/45.34, 328, 329, 206/334, 521, 591; 220/DIG. 19, 82 R, 307; 361/331, 380, 220, 171-172; 307/10 AT; 340/825.31, 825.5; 70/277, DIG. 46; 200/43.05

[56] References Cited

U.S. PATENT DOCUMENTS

| | | | |
|---|---|---|---|
| 4,207,665 | 6/1980 | Kurek | 29/270 |
| 4,460,087 | 7/1984 | De Marco et al. | 220/307 |
| 4,485,531 | 4/1984 | Murphy | 361/220 |
| 4,592,481 | 6/1986 | Chen | 206/328 |
| 4,605,140 | 8/1986 | Koors | 220/DIG. 19 |

FOREIGN PATENT DOCUMENTS 2112753 6/1983 United Kingdom ............... 206/328

Primary Examiner—A. D. Pellinen
Assistant Examiner—Gregory D. Thompson
Attorney, Agent, or Firm—Marc D. Schechter

[57] ABSTRACT

A container for generally flat, rectangular electronic components (so-called chips). The container comprises a tubular housing which can be closed on at least one of its ends by means of a closure member. The closure member can be clamped in at least one recess in a wall of the housing. The closure member is in the form of a key having a shaft and a handle. The shaft has, viewed in the longitudinal direction of the handle, a thickness substantially equal to the distance between the wall of the tubular housing provided with the recess and the opposite wall. The shaft has a thickened part in a direction at right angles to the longitudinal direction of the handle. The thickened part has a cross-section substantially corresponding to the dimensions of the recess. Furthermore, the distance of the handle from the thickened part corresponds to the distance of the end of the tubular housing from the recess. Consequently, the key is inserted into the tubular housing and then rotated 90° to cause the thickened part of the shaft of the key to engage the recess in the wall of the housing.

10 Claims, 4 Drawing Figures

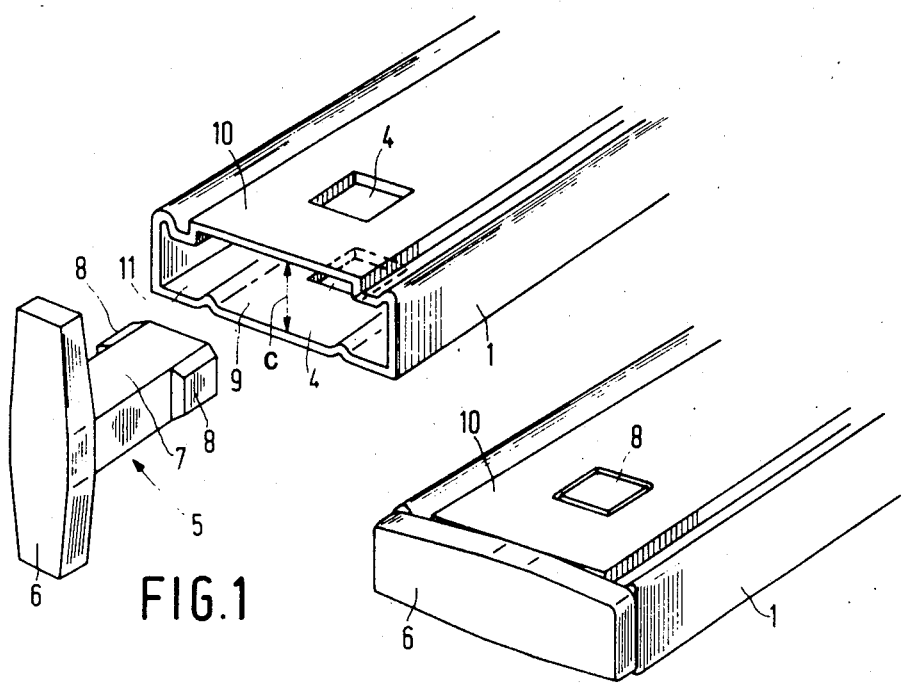
FIG.1
FIG.2
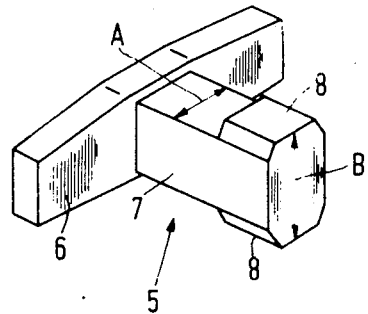
FIG.3
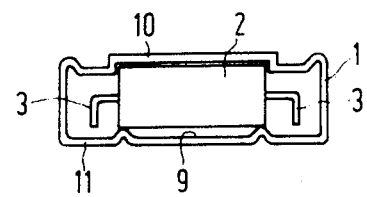
FIG.4

CONTAINER FOR ELECTRONIC COMPONENTS

BACKGROUND OF THE INVENTION

The invention relates to a container for generally flat rectangular electronic components, so-called chips. The container comprises a tubular housing with a cross-sectional area suitable to receive the electronic components. The container is made of a synthetic material. The tubular housing can be closed on at least one of its ends by a closure member, which can be clamped in at least one recess in a side (or wall) of the housing.

Such containers are used for the transport of components, such as integrated circuits, transistors, resistors, capacitors and the like. They are frequently used as a supply magazine in machines for automatic mounting of components on a support provided with a conductive wiring.

A container of the kind described above is disclosed in U.S. Pat. No. 4,207,665. In this case, a pin is passed through openings in each of two opposite walls of the tube. The pin is consequently arranged at right angles to the longitudinal direction of the tube. Such a pin cannot always be provided in a simple manner. The pin projects from the walls, which is inconvenient both for transporting the components and for automatically supplying components. The use can also be adversely affected by manufacturing tolerances.

Closure members are also known which are made of a flexible material, such as rubber, and are slipped into the end of the tube and must remain in place by friction. However, it has been found that these closure members do not always remain clamped in the tube. When these members are disengaged, the packed components are lost.

SUMMARY OF THE INVENTION

It is an object of the invention to provide a container of the aforementioned kind, which can be arranged in a very simple manner, which operates in a very reliable manner, and which is suitable as a supply container in an apparatus for automatic mounting of components.

In order to achieve this object, in the container according to the invention the closure member has the form of a key comprising a shaft and a handle. The shaft has a thickness in the longitudinal direction of the handle substantially equal to the distance between the walls of the tubular housing provided with the recess. The shaft has a thickened part in a direction at right angles to the longitudinal direction of the handle. The cross-section of the thickened part corresponds substantially to the dimensions of the recess. The distance of the handle from the thickened part corresponds to the distance of the end of the tubular housing from the recess (opening).

The shaft of the key-shaped closure member can be inserted into the tubular housing and can then be rotated a quarter turn. As a result, the thickened part of the shaft falls into the recess in the wall of the tubular housing and a perfect closure is obtained. The plane of the handle of the key now lies in the main plane of the tubular housing and thus need not comprise projecting parts. The key-shaped closure member can be provided in a very simple manner.

Preferably, both opposite walls of the tubular housing are provided with recesses, and a thickened part is formed on two opposite sides of the shaft of the key.

Furthermore, the handle of the key, viewed in the direction of the shaft, preferably has a form which roughly corresponds to the outer dimensions of the tubular housing, viewed in the longitudinal direction of the housing.

BRIEF DESCRIPTION OF THE DRAWING

FIG. 1 is a perspective view of a tubular housing and a closure member according to the invention, FIG. 2 is a perspective view similar to that of FIG. 1, in which the closure member is in the closed position.

FIG. 3 is a perspective view of the closure member.

FIG. 4 is a front elevation of the tubular housing with a component present in the housing.

DESCRIPTION OF THE PREFERRED EMBODIMENTS

In a preferred embodiment, the tubular housing 1 has a cross-section as shown in FIGS. 1 and 4. In FIG. 4, a component 2 present in the housing 1 is also shown. This component is an integrated circuit with conductors 3; other electronic components, such as resistors and capacitors, may also be accommodated in the tubular housing.

The tubular housing 1 has recesses 4 in two opposite walls 10 and 11. The housing is made of synthetic material and is preferably transparent. The profile of the tube is chosen so that the components 2 are guided therein in a suitable manner, as shown in FIG. 4.

The housing 1 can be closed by a closure member in the form of a key 5. The key 5 has a handle 6 and a shaft 7. In the embodiment shown, the shaft 7 is provided with thickened parts 8.

The thickness A (FIG. 3) of the shaft 7 (so viewed in the longitudinal direction of the handle 6) is substantially equal to the distance C (FIG. 1) between the inner sides of walls 10 and 11 in which the recesses 4 are formed. The thickness B (FIG. 3) at the area of the thickened parts 8, viewed in a direction at right angles to the longitudinal direction of the handle, is such that it corresponds approximately to the distance between the outer sides of the walls 10 and 11. The wall 11 has a channel 9, which is slightly wider than the distance B. The length and width dimensions of the ends of the thickened parts 8 are slightly smaller than the length and with dimensions of the recesses 4.

In order to close the tubular housing 1, the closure member 5 is arranged in the position shown in FIG. 1 with respect to the tubular housing 1 and is inserted into the housing. The channel 9 then forms a guide for the thickened parts of the shaft 7 and thus ensures that the shaft 7 is guided to the recesses 4.

The distance of the handle 6 from the thickened parts 8 is chosen to be equal to the distance of the end of the housing 1 from the recesses 4. When the handle 6 abuts against the tube end, the thickened parts 8 are consequently located at the recesses 4.

Now the handle is rotated a quarter turn and reaches the position shown in FIG. 2. Due to this rotation, the thickened parts 8 are arranged in line with the recesses 4 and fall into these recesses. This snap connection is possible because the housing 1 of synthetic material is slightly elastic. During rotation, the thickened parts 8 push the walls 10 and 11 slightly apart and, after the quarter turn has been performed, the walls 10 and 11 spring back again due to the fact that the thickened parts 8 snap into the recesses 4. Thus, an absolutely certain closure of the housing 1 is obtained.

In order to open the tubular housing 1, the handle 5 is first rotated a quarter turn. Then the closure member can be pulled out of the housing.

The closure member can also operate if there is only one thickened part 8 and, as the case may be, also only one recess 4. The embodiment shown is to be preferred, however.

The shape of the handle 6 is not critical. For practical reasons, it will preferably correspond to the shape of the outer side of the housing end, as shown in FIG. 2. The handle then does not project from the profile of the housing. The handle 6 may be provided with a recess, as a result of which automatic operation can be simplified.

The thickened parts 8 need not be formed at the end of the shaft. Depending upon the lengths of the components and the length of the housing, the shaft may be provided beyond the thickened parts with a projection in order to ensure that the components are enclosed immovably.

In a practical embodiment, the closure member consisted of a hard synthetic material. The distance A was 3.8 mm; the distance B was 4.6 mm. The recesses 4 were in the form of squares having sides of 3.4 mm, while the ends of the thickened parts were in the form of squares having sides of 3.2 mm. The distance of the housing end from the recesses 4 and hence also the distance of the handle 6 from the thickened parts 8 was 4.5 mm.

What is claimed is:

1. A container for generally flat, rectangular electronic components, said container comprising:
    a tubular housing having a cross-section with an inside height and an inside width, the width exceeding the height, said tubular housing having top and bottom walls defining the height and side walls defining the width, said tubular housing having an end, said top wall having a recess therein spaced from the end of the tubular housing, said tubular housing being made of a synthetic elastic material; and
    a closure member arranged in the end of the tubular housing, said closure member being in the form of a key having a handle and a shaft, the shaft extending from the handle into the tubular housing, the shaft having a thickened portion spaced from the handle a distance equal to the spacing of the recess from the end of the tubular housing, said thickened portion having a cross-section with a height and width, the height of the thickened portion of the shaft being larger than the inside height of the tubular housing, the width of the thickened portion of the shaft being substantially equal to the inside height of the tubular housing, said shaft being rotatable in the tubular housing, said thickened portion of the shaft being engageable in the recess in the top wall of the tubular housing, said handle being substantially aligned with the tubular housing when the thickened portion of the shaft engages the recess.

2. A container as claimed in claim 1, characterized in that:
    the bottom wall of the tubular housing has a recess therein spaced from the end of the tubular housing; and
    the shaft has a second thickened portion spaced from the handle a distance equal to the spacing of the recess in the bottom wall from the end of the tubular housing, said second thickened portion having a cross-section with a height and width, the height of the second thickened portion of the shaft being larger than the inside height of the tubular housing, the width of the second thickened portion of the shaft being substantially equal to the inside height of the tubular housing, said second thickened portion of the shaft being engageable in the recess in the bottom wall of the tubular housing, said handle being substantially aligned with the tubular housing when the second thickened portion of the shaft engages the recess in the bottom wall of the tubular housing.

3. A container as claimed in claim 2, characterized in that the handle has a cross-section, viewed in the direction of the shaft, which corresponds substantially to that of the tubular housing.

4. A container as claimed in claim 3, characterized in that either the top or the bottom wall of the tubular housing has a channel guiding the thickened portions of the shaft.

5. A container as claimed in claim 4, characterized in that the shaft has a length which exceeds the distances from the thickened portions of the shaft to the handle.

6. A container as claimed in claim 5, characterized in that the key is made of a hard synthetic material.

7. A container as claimed in claim 2, characterized in that:
    the thickened portions of the shaft are arranged on opposite sides of the shaft; and
    the thickened portions of the shaft are spaced equal distances from the handle.

8. A container as claimed in claim 2, characterized in that the thickened portions of the shaft are arranged at the end of the shaft.

9. A container as claimed in claim 1, characterized in that the shaft has a length which exceeds the distance from the thickened portion of the shaft to the handle.

10. A container as claimed in claim 1, characterized in that the thickened portion of the shaft is arranged at the end of the shaft.

* * * * *